US011450557B2

(12) United States Patent
Hsu et al.

(10) Patent No.: US 11,450,557 B2
(45) Date of Patent: Sep. 20, 2022

(54) POISONED METAL LAYER WITH SLOPED SIDEWALL FOR MAKING DUAL DAMASCENE INTERCONNECT

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Min Han Hsu, Hsinchu (TW); Chun-Chang Chen, Taichung (TW); Jung-Chih Tsao, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (TW)

( * ) Notice: Subject to any disclaimer, the term of this patent is extended or adjusted under 35 U.S.C. 154(b) by 20 days.

(21) Appl. No.: 16/801,706

(22) Filed: Feb. 26, 2020

(65) Prior Publication Data
US 2021/0210378 A1 Jul. 8, 2021

(30) Foreign Application Priority Data
Jan. 7, 2020 (CN) .......................... 202010013805.5

(51) Int. Cl.
*H01L 21/768* (2006.01)
*H01L 21/033* (2006.01)
(Continued)

(52) U.S. Cl.
CPC .... *H01L 21/76807* (2013.01); *H01L 21/0332* (2013.01); *H01L 21/0337* (2013.01);
(Continued)

(58) Field of Classification Search
CPC ......... H01L 21/76807; H01L 21/76877; H01L 21/76811; H01L 21/0337; H01L 21/0332;
(Continued)

(56) References Cited

U.S. PATENT DOCUMENTS 6,514,844 B1 * 2/2003 Martin .............. H01L 21/31155
257/E21.248
7,199,046 B2 * 4/2007 Wetzel ................ H01L 21/0276
257/E21.029
(Continued)

FOREIGN PATENT DOCUMENTS

| CN | 104701143 | 6/2015 |
| TW | 200908146 | 2/2009 |
| TW | 201722709 | 8/2017 |

OTHER PUBLICATIONS

Office Action dated Nov. 11, 2020 for corresponding case No. TW 10921092840. (pp. 1-4).

*Primary Examiner* — Bac H Au
(74) *Attorney, Agent, or Firm* — Hauptman Ham, LLP

(57) ABSTRACT

A method of making a dual damascene interconnect includes operations of depositing a metal hardmask over a dielectric layer; etching a metal hardmask opening in the metal hardmask to expose a top surface of the dielectric layer; etching at least one interconnect opening in the dielectric layer, to expose a top surface of a base conductive layer; modifying a sidewall of the metal hardmask opening; and depositing a conductive material in the metal hardmask opening and the at least one interconnect opening.

20 Claims, 7 Drawing Sheets

(51) Int. Cl.
  *H01L 21/311* (2006.01)
  *H01L 23/528* (2006.01)
  *H01L 21/288* (2006.01)
  *H01L 21/285* (2006.01)
  *H01L 23/532* (2006.01)

(52) U.S. Cl.
  CPC .... *H01L 21/2885* (2013.01); *H01L 21/28568* (2013.01); *H01L 21/31111* (2013.01); *H01L 21/31144* (2013.01); *H01L 21/76873* (2013.01); *H01L 21/76877* (2013.01); *H01L 23/5283* (2013.01); *H01L 23/53228* (2013.01)

(58) Field of Classification Search
  CPC ........... H01L 21/2885; H01L 21/76873; H01L 23/5283; H01L 23/53228; H01L 21/31111; H01L 21/28568; H01L 21/31144
  See application file for complete search history.

(56) References Cited

U.S. PATENT DOCUMENTS

| | | | | |
|---|---|---|---|---|
| 8,586,478 | B2* | 11/2013 | Soda | H01L 21/76897 438/671 |
| 9,059,250 | B2* | 6/2015 | Choi | H01L 21/31144 |
| 9,412,648 | B1* | 8/2016 | Shiu | H01L 21/76802 |
| 9,659,811 | B1* | 5/2017 | Peng | H01L 21/76811 |
| 9,728,501 | B2* | 8/2017 | Chang | H01L 21/0228 |
| 9,929,012 | B1* | 3/2018 | Belyansky | H01L 21/02266 |
| 10,347,528 | B1* | 7/2019 | Singh | H01L 21/76843 |
| 10,672,705 | B2* | 6/2020 | Xu | H01L 21/0228 |
| 11,018,052 | B2* | 5/2021 | Yang | H01L 21/76831 |
| 2002/0102854 | A1* | 8/2002 | Givens | H01L 21/28518 438/692 |
| 2003/0129842 | A1* | 7/2003 | Wang | H01L 21/76813 438/694 |
| 2006/0091559 | A1* | 5/2006 | Nguyen | H01L 21/02216 257/775 |
| 2010/0197133 | A1* | 8/2010 | Werner | H01L 21/76804 438/637 |
| 2012/0187546 | A1* | 7/2012 | Akinmade-Yusuff | H01L 21/31144 257/622 |
| 2012/0302068 | A1* | 11/2012 | Chen | H01L 21/31144 438/702 |
| 2013/0095652 | A1* | 4/2013 | Harada | H01L 21/31144 438/622 |
| 2013/0183825 | A1* | 7/2013 | Liou | H01L 21/76807 438/675 |
| 2013/0313717 | A1* | 11/2013 | Holmes | H01L 23/528 257/774 |
| 2014/0038412 | A1* | 2/2014 | Hu | H01L 21/76811 438/689 |
| 2014/0113438 | A1* | 4/2014 | Usami | H01L 21/02592 438/482 |
| 2015/0162240 | A1* | 6/2015 | Chiu | H01L 21/76843 438/653 |
| 2015/0162280 | A1* | 6/2015 | Pan | H01L 21/0337 257/774 |
| 2015/0221549 | A1* | 8/2015 | Ponoth | H01L 21/0334 438/643 |
| 2017/0125353 | A1* | 5/2017 | Chen | H01L 21/76816 |
| 2019/0237331 | A1* | 8/2019 | Lu | H01L 21/0338 |

* cited by examiner

POISONED METAL LAYER WITH SLOPED SIDEWALL FOR MAKING DUAL DAMASCENE INTERCONNECT

PRIORITY CLAIM

The present application claims priority to the China Patent Application No. 202010013805.5, filed Jan. 7, 2020, which is incorporated herein by reference in its entirety.

BACKGROUND

Dual damascene interconnects provide reliable interconnections between layers of an integrated circuit. Voids in interconnects increase electrical resistance and reduce overall reliability of an integrated circuit, and slow the clock speed of the device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
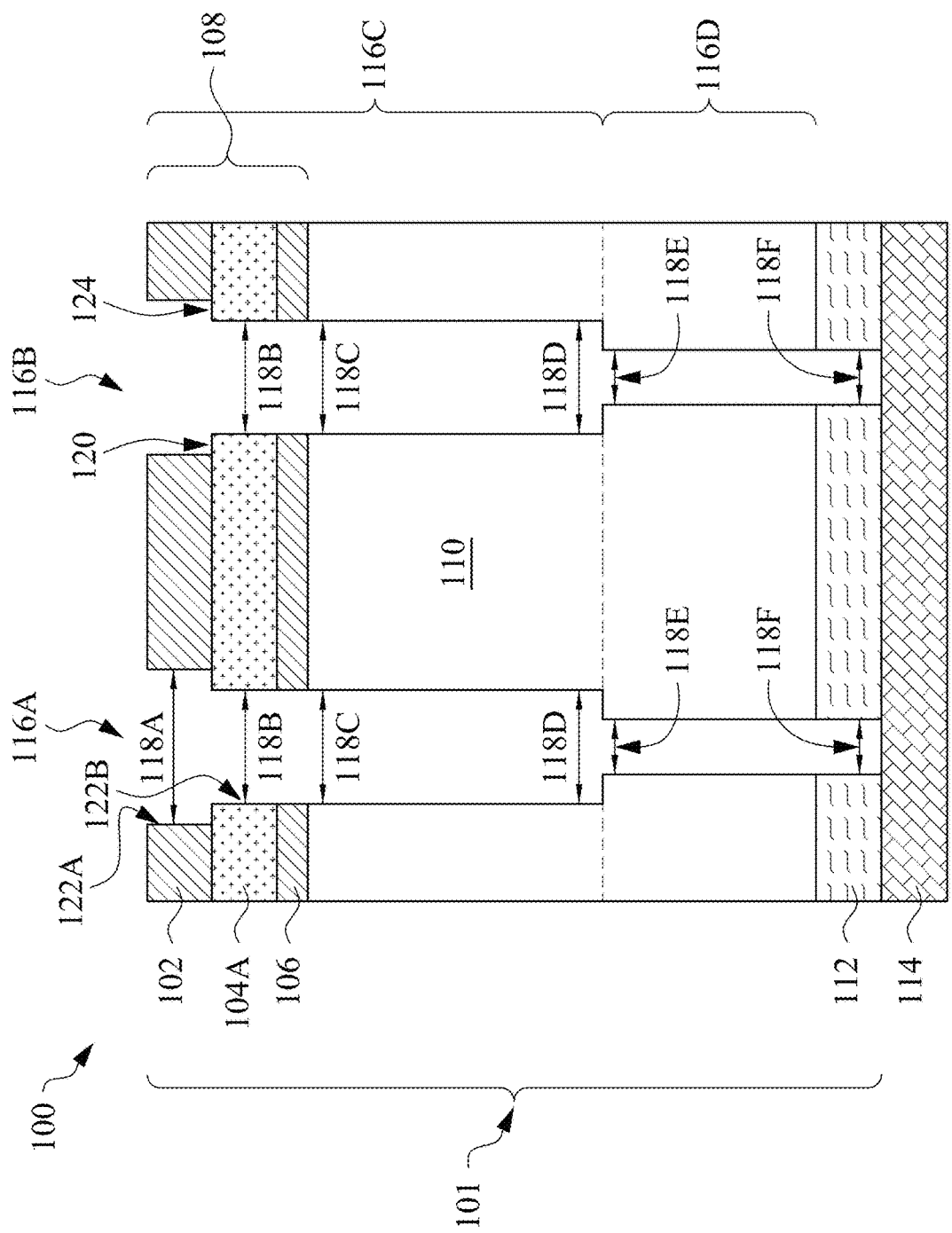
FIGS. 1A-1B are cross-sectional diagrams of a semiconductor device during a manufacturing process, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When manufacturing a semiconductor device or integrated circuit having dual damascene interconnects, the conductive material added to the dual damascene structure opening is added in at least two processes. After the trench and via openings are formed in one or more layers of dielectric materials, a layer of seed material is deposited into the trench and via openings. A layer of seed material is also deposited against underlying conductive material at the bottom of the dual damascene structure opening before bulk conductive material is added to the dual damascene structure. In some instances, the seed material, or seed layer, is sputtered onto the sidewalls of the dual damascene structure, and on an exposed portion of the underlying conductive material. The seed layer comprises, in some embodiments, pure copper or a copper alloy. The bulk conductive material is filled into the dual damascene structure opening by electroplating, which results in a filled dual damascene structure and a layer of conductive material on a top surface of the die where the dual damascene structure is being formed. In some embodiments, electroplated bulk conductive material is copper or a copper alloy. In some embodiments, the seed layer and the electroplated bulk conductive material are the same alloy. In some instances, the seed layer and the electroplated bulk conductive material are different materials, to promote adhesion of the seed layer to a liner on a sidewall of a dual damascene structure and/or reduction of voids in the electroplated bulk conductive material.

Because electroplating of conductive materials is sensitive to the diffusion rate of materials into openings such as dual damascene structures, obstructions or features that promote non-uniform seed layer deposition impact the flow of dissolved ions of conductive materials into dual damascene structures during electroplating processes. Restriction of ions of conductive material into openings leads to the formation of voids in the resulting interconnection structure, with concomitant increases in resistance of the interconnection structure above a threshold interconnection structure resistance for an integrated circuit.

Reduction and/or elimination of voids in interconnection structures leads to an overall reduction in the resistance of the integrated circuit containing the interconnection structures. Lowered resistance also contributes to a faster overall switching time for the transistors of the integrated circuit.

FIG. 1 is a cross-sectional diagram of a semiconductor device 100 during a manufacturing process, in accordance with some embodiments. FIG. 5 is a flow diagram of a method 500 of making a copper interconnect, in accordance with some embodiments. Operations of the method 500 are described below, and the description makes reference to elements of the dual damascene trench structures and copper interconnect structures of FIGS. 1-4, as being representative of embodiments of the present disclosure, throughout.

Semiconductor device 100 includes dual damascene structure 101 above a base conductive layer 114. An etch stop layer 112 is over the base conductive layer 114, and a dielectric layer 110 is over etch stop layer 112. Base conductive layer 114 is, in some embodiments, a contact. In some embodiments, base conductive layer 114 is a metal line. In some instances, base conductive layer 114 is a dual damascene-style interconnect in a lower level of an integrated circuit. Thus, a base conductive layer stack is formed by either sputtering or electroplating, in order to accommodate the profile of the opening being filled and an integration scheme used in manufacturing the integrated circuit. In some embodiments, a base conductive layer is a contact in a lower level of a semiconductor device. In some embodiments, a base conductive layer is a metal line on a lower level of a semiconductor device. In some embodiments, a base conductive layer is a dual damascene structure in a different level of a semiconductor device.

Etch stop layer 112 includes one or more layers of a dielectric material with a lower etch selectivity to an etch process than dielectric layer 110, under the etch conditions with which interconnect openings are formed in the dielectric layer. In some instances, etch stop layers are made of one or more layers of silicon nitride or silicon oxy-nitride deposited onto a lower dielectric layer and directly beneath dielectric layer 110.

Dielectric layer 110 is an interlayer dielectric (ILD) deposited over etch stop layer 112. Dielectric layer 110 is etched to form openings for interconnect structures to be formed therein. Interconnect structures include dual damascene interconnect structures, having a via region and a bar/trench region. Dual damascene structure 101 has a trench opening in an upper region 116C and two or more via openings in a lower region 116D. According to some embodiments, the thickness of the upper region 116C and the thickness of the lower region 116D are approximately the same thickness. In some embodiments, the thicknesses of the upper region 116C and the lower region 116D are different thicknesses. In some embodiments, the thickness of the upper region 116C is smaller than the thickness of the lower region 116D.

Dielectric layer 110 includes silicon dioxide, spin on glass, boron-phosphorus spin on glass (BPSG), fluorinated silica glass (FSG), or an organic low-K dielectric material containing, for example silicon, oxygen, carbon, and hydrogen. A non-limiting example of an integrated circuit having an organic low-k dielectric material includes low-k dielectric materials such as BLACK DIAMOND®, porous silicon, or the like. A material used for dielectric layer 110 depends on the spacing between and width of adjoining lines (or, trenches) in the dielectric layer. Silicon dioxide is one example of a dielectric material which is deposited onto a contact etch stop layer (CESL) by chemical vapor deposition (CVD). Techniques of chemical vapor deposition include plasma enhanced chemical vapor deposition (PE-CVD), high-pressure chemical vapor deposition (HP-CVD), and so forth. BPSG, FSG, and various low-K dielectric materials are deposited onto a contact etch stop layer by various methods, including deposition of a liquid look a matrix followed by spinning a wafer to remove excess material, leaving behind a thin film of dielectric material on the substrate. Some examples of low-K dielectric materials are deposited onto a contact etch stop layer or other substrate by techniques similar to PE-CVD, where dielectric material is the result of a chemical reaction occurring in a plasma above the substrate where deposition occurs.

In some embodiments, dielectric layer 110 is a single film deposited in one process. In some embodiments, dielectric layer 110 includes a plurality of dielectric materials deposited over etch stop layer 112. Antireflective layer 106 of metal hardmask 108 is over dielectric layer 110. In some embodiments, antireflective layer 106 is directly against top surface of dielectric layer 110. Dual damascene structure 101 includes two openings 116A and 116B extending through metal hardmask 108, dielectric layer 110, and etch stop layer 112 to expose a top surface of base conductive layer 114.

Method 500 includes an operation 505, wherein a metal hardmask, such as metal hardmask 108 is deposited over a dielectric layer 110. Metal hardmask 108 includes antireflective layer 102, a metallic layer 104A (e.g., a metal nitride layer), and antireflective layer 106. In some embodiments, a metal hardmask includes a single antireflective layer and a metallic layer, rather than two antireflective layers and a metallic layer. When two antireflective layers are present in a metal hardmask, a first antireflective layer is above the metallic layer, and the second antireflective layer is below the metallic layer. In dual damascene structure 101, the antireflective layers 102 and 106, above and below the metallic layer 104A, are situated to improve photolithography of the metallic layer. Improved photolithography includes increased uniformity in the width of an opening, improved straightness of opening edges, and more vertical opening sidewalls. In some embodiments, a single antireflective layer is present above the metallic layer. In some embodiments, the single antireflective layer is present below the metallic layer. Antireflective layers adjust a photolithography process to achieve uniform line shape and profile of the sidewall of either the metallic layer or the underlying dielectric layer.

The number of antireflective layers included in the metal hardmask is a function of difficulties associated with forming openings through the metal hardmask and in the underlying dielectric layer. For some combinations of dielectric layer and metal hardmask, a single antireflective layer beneath metallic layer suffices to preserve uniform sidewall profile and line shape of the openings. When a sidewall of an opening through a nitride layer or in a dielectric layer has lateral oscillations, or a wavy shape, a second antireflective layer is included to improve the shape of the opening through both the metallic layer and into the dielectric layer.

According to some embodiments, the metallic layer 104A is a titanium nitride layer, although nitrides of other metals are also envisioned within the scope of the present disclosure. Other metals that are used to make a nitride layer of a hardmask include, but are not limited to, titanium, zirconium, tantalum, niobium, vanadium, tungsten, chromium, cobalt, nickel, silicon, and zinc.

Metallic layer 104A has a thickness ranging from about 10 nm to about 100 nm. Thicknesses of metallic layers that are greater than 100 nm add to the cost of manufacturing an integrated circuit, without producing an additional benefit in terms of improved line smoothness of trenches or vias of dual damascene structures. Metallic layers that are less than 10 nm thick do not resist etching processes for long enough to sufficiently reduce or prevent unanticipated line roughness of trenches or vias of dual damascene structures. Further, metallic layers that are less than 10 nm thick exhibit thickness variation that impacts the etch time to punch through the metal hardmask layers without modifying the depth of an etch into an underlying dielectric layer. When the metal hardmask etch process punches through the metal hardmask and into the dielectric layer, the depth of the trench portions of the interconnect opening is not uniform across a die, leading to deviations of interconnect structure resistance from a circuit specification throughout the circuit.

Antireflective layer 102 is deposited over dielectric layer 110, or on top of metallic layer 104A, in order to create more uniform structures developed by photolithographic techniques. Antireflective layers reduce and/or eliminate swing curves, standing waves in photoresist, and linewidth variation of a patterned line. Antireflective layers such as antireflective layers 102, 106 help to produce interconnects with resistance and other electrical properties that satisfy a design specification of the integrated circuit. Deviations of interconnect structure electrical properties from the design specification adversely affect the integrated circuit. Such deviations include increased resistance, slower switching time, parasitic capacitance, and electromigration. Antireflective layers 102, 106 independently have a thickness ranging from about 10 to about 100 nm. When an antireflective layer is thinner than about 10 nm, the antireflective layer does not provide sufficient protection, during an integrated circuit manufacturing process, from photolithographic defects described above. When an antireflective layer is thicker than about 100 nm, the antireflective layer does not provide additional benefit, consumes a greater amount of material and increases the complexity of manufacturing the integrated circuit. The increased complexity of manufacturing an integrated circuit is associated with processes of developing photoresist, removing photoresist, removing the antireflective layer, and cleaning residual particles from surfaces during the manufacturing process. In some embodiments, the antireflective layer is a BARC layer, a Topside ARC layer, or a DARC layer. In some instances, the anti-reflective layer is free of nitrogen.

Method 500 includes an operation 510, wherein an opening is etched in the metal hardmask. An opening in a hard mask is formed by depositing a layer of patterning material, such as photoresist, on a top surface of the metal hard mask, forming a pattern within the layer of patterning material, such as by photolithography or electron beam lithography, and removing a portion of the pattern to expose a top layer of the metal hard mask. Etching an opening in a metal hard mask includes one or more plasma etch steps in order to remove portions of the hard mask exposed within openings of the overlaying patterning layer. Chemistry, pressure, and power settings of plasma etch steps to remove portions of the metal hard mask are adjusted based on the materials of the metal hard mask and the size of the opening in the overlaying patterning layer.

Method 500 also includes an operation 515, in which at least one interconnect opening is formed below a metal hard mask. An interconnect opening extends through both the layers of a metal hardmask, a dielectric layer, and a CESL in a semiconductor film stack, according to some embodiments. Interconnect openings are formed in multiple steps. One step of an operation where an interconnect opening is formed includes at least one etch process to form one or more openings in a metal hardmask layer such as metal hardmask 108. In some embodiments, one step of an operation for forming interconnect openings includes forming a trench in an upper portion of a dielectric layer, followed by forming a via extending through a lower portion of the dielectric layer. In some instances, the via is formed first, followed by the trench portion of the interconnect opening. For purposes of the present discussion, descriptions of operations for forming an interconnect opening will include a trench-first scheme, as described herein below, although a via-first scheme is also envisioned by the present disclosure. In some embodiments, one step of an operation for forming interconnect openings also includes forming openings in a CESL below the dielectric layer, to expose a conductive base layer.

In a trench-first scheme for making interconnect openings, an opening 116A, 116B in the metal hard mask 108 corresponds to an outline of a trench to be formed in an upper portion 116C of the dielectric layer 110. In dual damascene structure 101, upper portion 116C includes both an opening in an upper part of the dielectric layer 110, and the opening in the metal hard mask 108.

Once a trench has been formed in upper region 116C, any residual patterning material left on a top surface of metal hard mask 108 is removed and a second layer of patterning material is deposited on a top surface of the metal hard mask, and within the trench openings in upper region 116C. During a second patterning step, portions of the second patterning material are removed, either from the top surface of metal hard mask 108, or from areas within the upper region 116C, to form a second pattern on a die surface for etching vias. After the pattern in the second patterning material is formed, a second etch process is undertaken to form vias in a lower region 116D. Lower region 116D, as shown in dual damascene structure 101, includes a lower portion of dielectric material 110, and etch stop layer 112. Subsequent to the etch process used to form vias in the lower region 116D, the second patterning material is removed from the die surface.

Dual damascene structure 101 is an unfilled structure, where two openings 116A and 116B extend through the metal hardmask 108 to expose some of the base conductive layer 114. Openings 116A and 116B of dual damascene structure 101 have different diameters at locations above base conductive layer 114. Moving downward from the top surface of the metal hardmask, openings 116A and 116B have a first width 118A at a level of antireflective layer 102, a second width 118B at a level of the metallic layer 104A, a third width 118C at an interface of dielectric layer 110 and antireflective layer 106, a fourth width 118D at a bottom of the trench region 116C of openings 116A and 116B, a fifth width 118E at a top of the via region 116D of openings 116A and 116B, and a sixth width 118F at a bottom of the via region 116D. Again, moving downward, first width 118A is larger than second width 118B, second width 118B is larger than third width 118C, third width 118C is larger than fourth width 118D, fourth width 118D is larger than fifth width 118E, and fifth width 118E is larger than sixth width 118F.

A sidewall 122A of antireflective layer 102 does not vertically align with the sidewall 122B of metallic layer 104A, as indicated by the different widths 118A and 118B of opening 116A. Thus, at an interface 120 between antireflective layer 102 and metallic layer 104A, a step or "kink" is situated such that a top surface 124 of metallic layer is exposed within the opening of the dual damascene structure. When a top surface 124 of metallic layer 104A is exposed, deposition of a seed layer of conductive material into a dual-damascene structure opening proceeds more rapidly at the location of the step at the exposed top surface 124. Thus, during deposition of the seed layer, the seed layer grows non-uniformly. The location of fastest seed layer growth occurs at the location of the exposed top surface 124, such that the opening of a dual-damascene structure has a smaller diameter than lower portions of the dual damascene structure after seed layer deposition. In the present disclosure, a method 500 describes a process of forming an interconnect structure without the above-mentioned non-uniform seed layer deposition.

Method 500 includes an operation 520, in which a portion of a metal hardmask is modified to produce a sloped sidewall, according to some embodiments. In operation 520, the metal hardmask is modified by processing the metal hardmask to diffuse non-metal atoms into the metallic layer (or, in some embodiments, a metal layer) in order to produce a stack of material with different lattice constants at different positions in the stack of material. As a lattice constant of a material changes, the size of the material changes as well. In the present disclosure, addition of a non-metal atom to a metal layer, or to a metallic layer, increases the lattice constant and corresponds to the metallic layer swelling or expanding upon incorporation of the non-metal atoms.

Processing the metal hardmask includes an annealing process and/or a plasma process to heat the metal hardmask. Plasma processing also includes generation of ionized atoms above a surface of the semiconductor device during the process that penetrate into one or more layers of the metal hard mask to modify the composition and the shape of the metal hard mask. The new layer, or poisoned layer, includes components of both the metallic layer and the antireflective layer and has a sloped sidewall which replaces the step, or exposed upper surface 124 of the metallic layer 104A, as described above. Poisoning of a layer or material refers to the modification of a layer by diffusion of atoms from an adjoining layer into the poisoned layer.

Figure 1B:
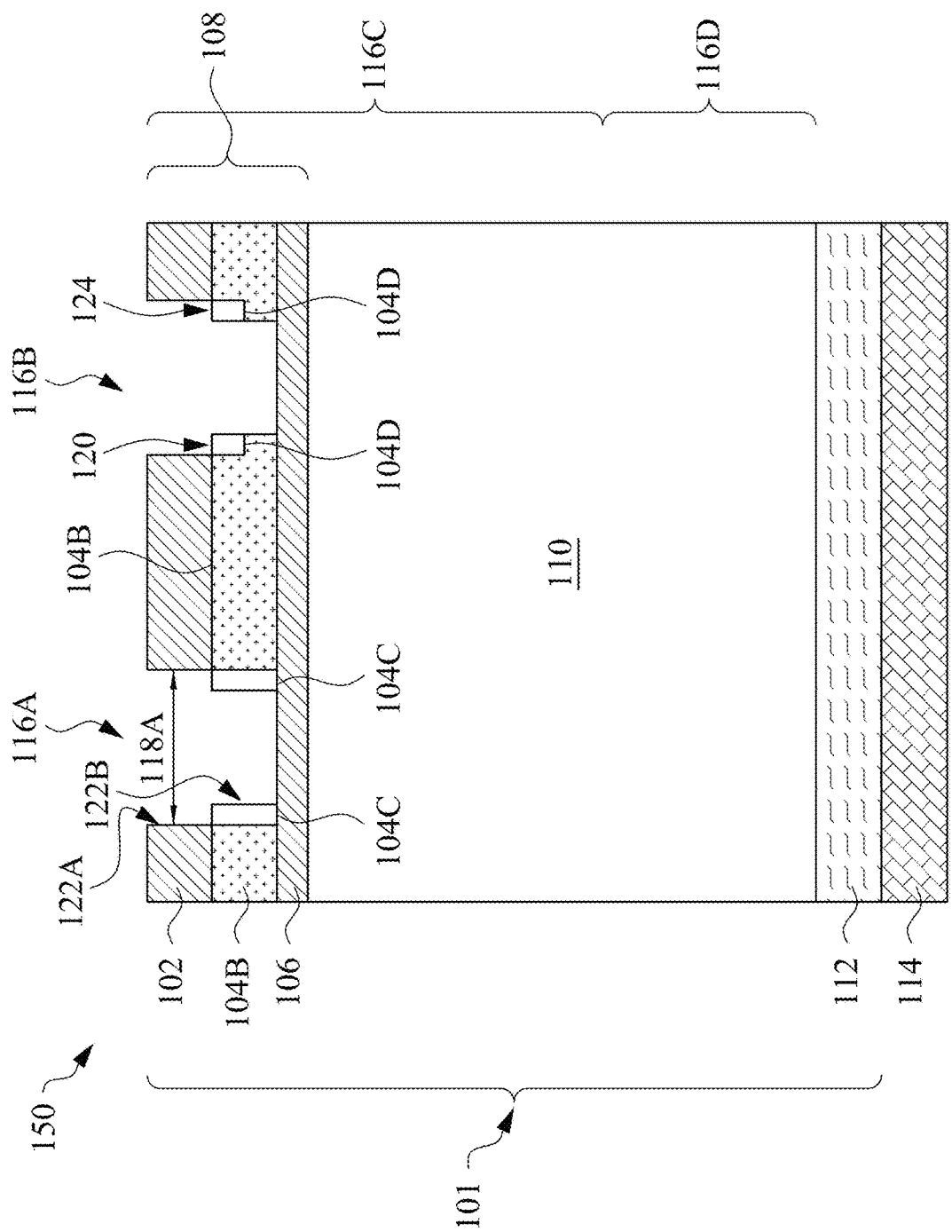

FIG. 1B is a cross-sectional diagram of a semiconductor device 150 during a manufacturing process, in accordance with some embodiments. Elements of FIG. 1B which correspond to elements of FIG. 1A have a same reference numeral. A person of ordinary skill will understand that the disclosure relates to additional embodiments than those shown herein, and that there the features described herein are used for convenience to describe the scope of the present disclosure and methods of making semiconductor devices.

FIG. 1B includes a metal hard mask 104B with a non-metal atom-treated surface 104C. According to some embodiments, the metal hard mask 104B is deposited over dielectric layer 110 and subsequently treated with non-metal atom to modify the interface between the metal layer and one or more antireflective layers, such that part of the metal hard mask 104B is converted to a non-metal atom-enriched metal region 104C. In some embodiments, the process of adding non-metal atoms to a layer, including a metal hard mask, is known as poisoning the layer. In some embodiments, metal hard mask 104B is enriched with non-metal atoms by exposing the sidewalls 122B of the metal hard mask 104B to a plasma of dissociated non-metal atoms in the absence of oxygen, such that the atoms generated in the plasma are accelerated toward the exposed surface of the metal hard mask, and penetrate into the metal hard mask. In some embodiments, the non-metal atoms are nitrogen atoms. In some embodiments, the non-metal atoms are a mixture of nitrogen and oxygen. For the discussion below, the non-metal atom discussed is nitrogen, although other atoms are envisioned in the present disclosure.

Addition of nitrogen to the metal hard mask 104 modifies the chemical composition of the metal hard mask layer and modifies the lattice constant of the material. According to an embodiment, a lattice constant of a material determines an amount of strain in the material, as the material transitions between layers of other material above and below the material with the modified lattice. In some embodiments, adding material to modify the lattice constant of a material causes the material to swell or increase in size, because the lattice constant is larger, after the modification (*e.g., adding nitrogen to a metal hard mask) than before the modification. In some embodiments, the addition of a non-metal atom to a metal hard mask shrinks the lattice constant, causing the material to contract. In some embodiments, the metal hard mask is "poisoned" by addition of nitrogen from nitrogen-rich plasma before anti-reflective layer 106 is opened to expose substrate 110. In some embodiments, the metal hard mask is "poisoned" by addition of nitrogen from nitrogen-rich plasma after anti-reflective layer 106 has been opened and substrate 110 is exposed to the plasma. Exposing the substrate 110 to nitrogen-rich plasma modifies the exposed portion of the substrate 110 in addition to the exposed sidewall of the metal hard mask layer 104B. Poisoning the metal hard mask layer 104B before opening the antireflective layer 106 preserves the chemical composition and physical structure of substrate 110 from modification, making an etch process to form the interconnect opening (see 116A and 116B) more uniform, and faster than if the substrate is enriched in nitrogen.

Nitrogen-enriched region 104C covers an entirety of the exposed top portion and sidewall of metal hardmask material in opening 116A. Nitrogen-enriched region 104D covers the exposed top portion, and an upper portion of the sidewall, of metal hardmask material in opening 116B. The degree of coverage of the nitrogen-enriched region on sidewall of metal hardmask 104B is a function of the plasma characteristics (e.g., the ion acceleration characteristics) of the plasma used to generate the dissociated nitrogen atoms. As the etch plasma becomes more anisotropic, the degree of sidewall coverage increases.

Figure 2:
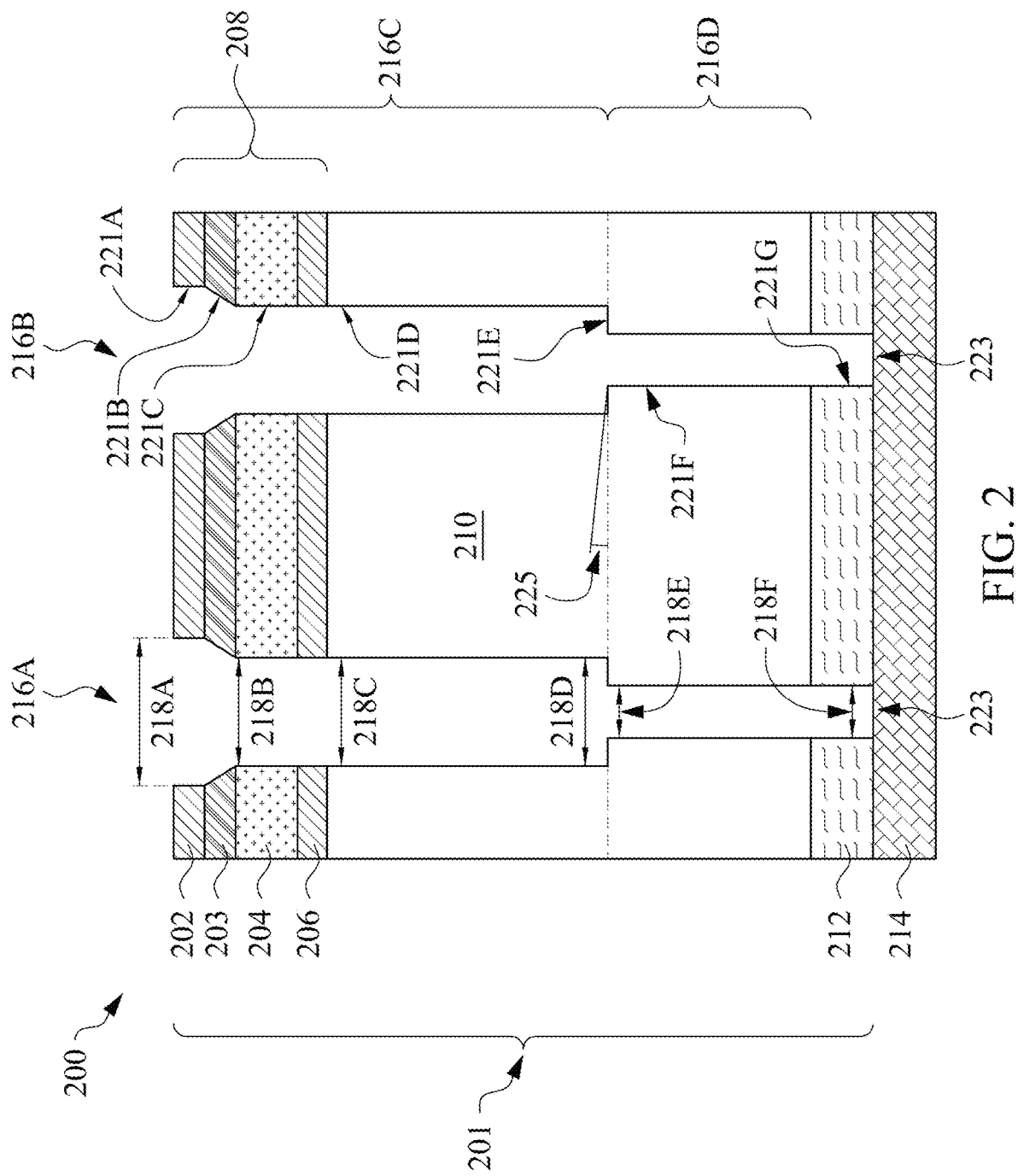
FIG. 2 is a cross-sectional diagram of a semiconductor device with a sloped sidewall profile during a manufacturing process, in accordance with some embodiments.

FIG. 2 is a cross-sectional diagram of a semiconductor device 200 with a sloped sidewall profile during a manufacturing process, in accordance with some embodiments. Elements of FIG. 2 that are similar to elements of FIG. 1, described above, have a same reference numeral, incremented by 100. A sidewall of the metal hardmask is modified by heating the antireflective layer and metallic layer to cause compounds from the antireflective layer and metallic layer to bleed into each other. Thus, antireflective layer 202 and metallic layer 204, which are directly against each other in FIG. 1, are separated from each other in FIG. 2 by poisoned layer 203. Antireflective layer 202 has a sidewall 221A that is approximately vertical. Metallic layer 204 has a sidewall 221C that is approximately vertical. Poisoned layer 203 has a poisoned layer sidewall 221B that is not vertical, but sloped, bridging the space between sidewall 221A and sidewall 221C, which are laterally separated from each other. Sidewall 221C has a slope approximately the same as a slope of sidewall 221D of the trench region in dielectric 210. In some embodiments, the slope of sidewall 221C is different from the slope of sidewall 221D. Sidewall 221F is an upper portion of the sidewall of the via region of the interconnect structure opening 216A/216B, and sidewall 221G is a sidewall of a lower portion of the via region of the interconnect structures. Exposed surface 223 of base connector layer 214 is at a bottom of interconnect structures 216A and 216B. Sidewall 221E is located between sidewall 221D and 221F. In some embodiments, angle 225 ranges from 10 to 70 degrees, although other angles are also contemplated within the scope of the present disclosure. According to theory and belief, interconnect structures having angle 225 smaller than 20° are prone to formation of voids in the metal fill of the interconnect structure. In some embodiments, seed layer deposition becomes sporadic or uneven in a lower part of interconnect structure (e.g., along portions of sidewall 221F) for values of angle smaller than 20°. Metal fill of the interconnect structure is prone to void formation in embodiments of an interconnect structure wherein angle 225 is smaller than 20° because of uneven accumulation of material at the corner between sidewall 221E and sidewall 221F.

In some embodiments, modifying the metal hardmask sidewall, or poisoning a layer of the metal hardmask, includes one or more steps related to annealing and/or processing the metal hardmask in a plasma. When metal hardmask poisoning occurs by annealing, the annealing step includes one or more of rapid thermal processing (RTP), pulsed laser annealing, or other rapid annealing processes that contribute to inter-layer diffusion of atoms without causing melting of one or more layers of the metal hardmask. Annealing or rapid thermal processing of metal hardmask layers involves heating the metal hardmask to temperatures ranging from 600° Celsius to 900° C. for periods up to 60 seconds. In some embodiments, elevated temperatures ranging form 600° C. to 700° C. are maintained for periods ranging from 40 to 60 seconds. In some embodiments, elevated temperatures ranging from 700° C. to 800° C. are maintained for periods ranging from 20 to 40 seconds. In some embodiments, elevated temperatures ranging from 800° C. to 900° C. are maintained for periods ranting from 10 to 20 seconds. In some embodiments, elevated temperatures ranging from 900° C. to 1000° C. are maintained for periods ranting from 1 to 10 seconds. In some embodiments, thermal processing is performed at temperatures over 1000° C. with exposure times of less than one second at peak temperatures are employed in order to promote diffusion of atoms without melting of metal hardmask layers. In some instances, peak temperatures of laser annealing processes achieve greater than 1300°, with exposure times on the order of milliseconds or microseconds.

In some embodiments, modifying metal hardmask sidewall includes exposing the metal hardmask, after the interconnect opening is formed, to a nitrogen-containing plasma. The nitrogen-containing plasma generates nitrogen ions in the plasma that contaminate exposed antireflective layer coatings or sidewalls and heat the metal hardmask to promote metal diffusion out of the metallic layer and into one or more of the antireflective layers present in the metal hardmask. During exposure of the metal hardmask to nitrogen-containing plasma, little or no etching takes place. Rather, nitrogen in the plasma is ionized and nitrogen ions react with exposed portions of the antireflective layers. Reflective layers, typically being organic layers, are susceptible to nitrogen uptake from plasma or adjoining materials in a film stack.

Modification of the metal hardmask to form a poisoned layer in the metal hardmask includes forming a poisoned layer having a thickness ranging from about 0.1 nm to about 10 nm. Poisoned layers less than 0.1 nm do not have sufficient vertical thickness to bridge the lateral gap between the sidewall of the antireflective layer and the metallic layer in a metal hardmask. Poisoned layers greater than 10 nm in thickness are associated with increased risks in melting the metal hardmask layers, making partial or complete removal of metal hardmask more difficult after the conductive material is deposited in an interconnect opening. Poisoned layers (or, poisoned metal layers) have a compositional ratio of metal to non-metal atoms of between 0.25:1 to 1:1. When a metal compositional ratio is smaller than 0.25:1, the sidewall of the poisoned metal layer does not have a slope that avoids excessive collection of seed layer material. When a metal compositional ratio is greater than 1:1, the sidewall of the poisoned metal layer has a slope that avoids excessive collection of seed layer material, but the greater thickness of the poisoned metal layer does not promote reduction in seed layer uniformity. Poisoned metal layers with a compositional ratio of less than 0.25:1 do not exhibit sufficient mixing of the metallic and antireflective layer to achieve a sloped sidewall compatible with void-free bulk conductive material electroplating.

The metal compounds in the metallic layer 104A have a chemical formula of $A_xB_y$ where A is the metal and B is the non-metal atom. Metal compounds (metallic layers) of the metal hardmask have a compositional ratio (x:y) of metal to nonmetal atoms of between 1:1 to 1:3. When a nitrogen compositional ratio of the metallic layer is less than 1:1, there is insufficient nitrogen in the metallic layer to form a poisoned metal layer that exhibits reduced seed layer material collection. When a nitrogen compositional ratio of the metallic layer is greater than 1:3, the metallic layer has insufficient metal to form a poisoned metal layer with an antireflective layer. In some embodiments, the metal A is titanium (Ti), and the non-metal atom is nitrogen (N). In some embodiments, the metal atom A is titanium and the non-metal is a mixture of nitrogen and oxygen (O), such that $A_xB_y$ is $Ti_xN_yO_z$. In some embodiments, other combinations of metal and non-metal are used according to semiconductor manufacturing processes known to those skilled in the art.

Method 500 includes an operation 525, wherein a conductive material is deposited into the at least one opening in the dielectric layer. In manufacturing dual-damascene structures in integrated circuits, conductive material is deposited in several steps. One step of operation 525, a seed layer of conductive material is sputtered onto a top surface of the metal hardmask 308 and onto sidewalls 221A-221G of interconnect structures. Another step of operation 525 includes electroplating of a conductive material into interconnect openings (the at least one opening in the dielectric layer). The seed layer (not shown) acts as one electrode for the electroplating process to proceed. Because poisoned layer 203 has a sloped sidewall 221B, electroplating of conductive material into the interconnect opening occurs with less likelihood of forming a void or pocket within the interconnect because there is no junction at a level of the interconnect opening corresponding to a level of the poisoned layer 203.

According to some embodiments, the seed layer (not shown) and the electroplated bulk conductive material are a same material. In some instances, the seed layer and bulk electroplated conductive material are different materials. Conductive materials used in formation of dual damascene interconnect structures include a copper and copper alloys. Copper alloys include copper admixed with aluminum, zinc, and other metals to promote uniform electrodeposition of material within an interconnect opening and to reduce grain size of the electroplated conductive material. In some embodiments subsequent to operation 525, one or more layers over the dielectric layer are removed by, e.g., chemical mechanical polishing (CMP) in order to prepare an integrated circuit for deposition of another dielectric material such as a contact etch stop layer (for, e.g., a dual damascene structure) or a dielectric layer in which a conductive line is to be manufactured.

Figure 3:
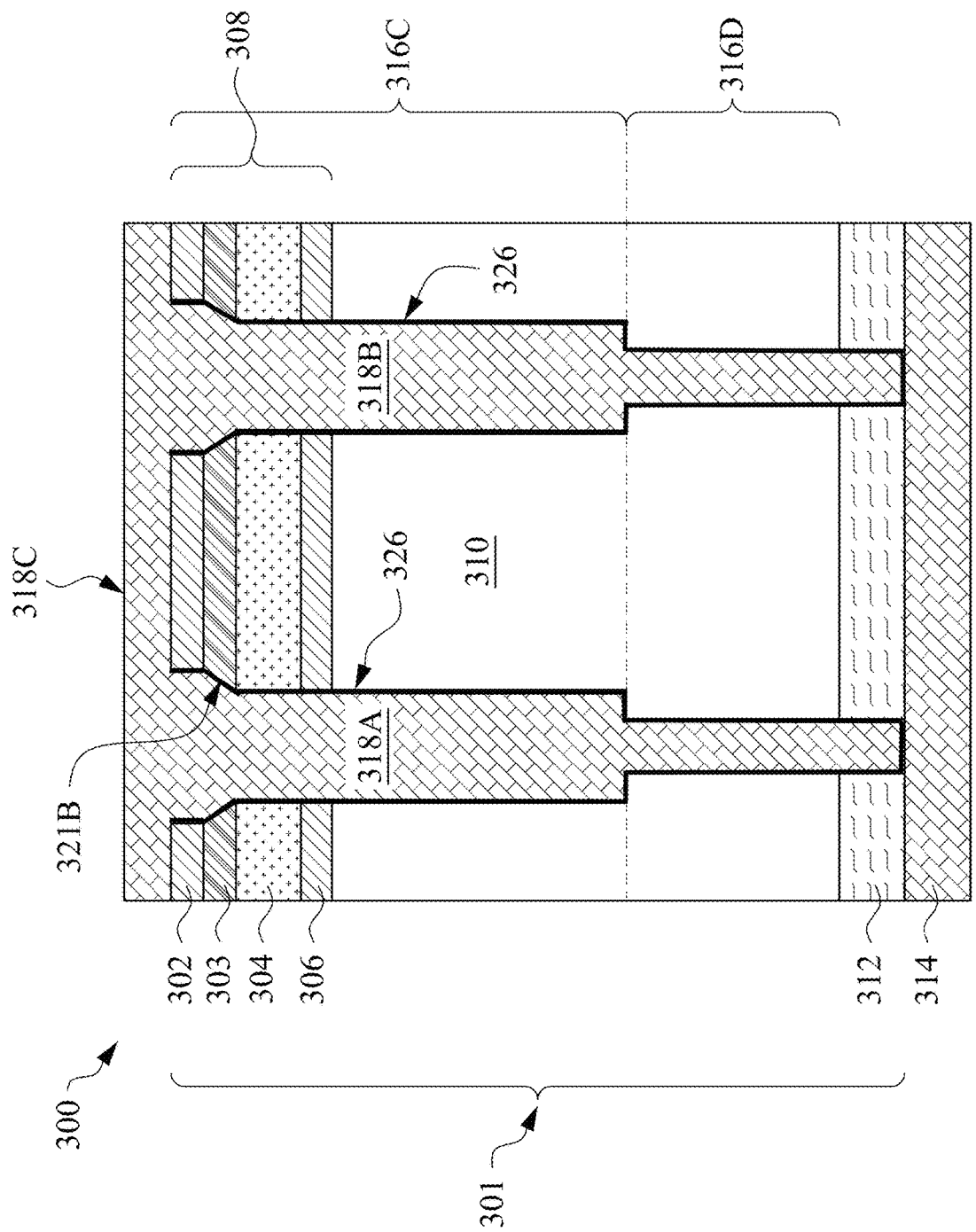
FIG. 3 is a cross-sectional diagram of a semiconductor device with a copper interconnect during a manufacturing process, in accordance with some embodiments.

FIG. 3 is a cross-sectional diagram of a semiconductor device 300 with a copper interconnect structure 301, in accordance with some embodiments. Elements of FIG. 3 that resemble elements of FIG. 2, above, have a same incremented by 100. In interconnect structure 301, conductive material covers the sides of the dual damascene structure openings, as well as the top of the metal hardmask 308. Thus, interconnect structures 318A and 318B are electrically connected by planar conductive material 318C. Interconnect structures 318A and 316B have a line region 316C and a via region 316D. The region 316D of each interconnect structure is electrically connected to base conductor 314.

Because poisoned layer 303 has a sloped sidewall 321B, deposition of a seed layer 326 of conductive material (copper or a copper alloy) onto sidewalls of the interconnect opening does not produce a constriction point at a top of the interconnect opening. By eliminating formation of a constriction at a top of the interconnect opening, interconnect structure 318A and 318B do not have voids or hollows located therein. In some embodiments, seed layer 326 is deposited into the interconnect opening (see elements 216A, 216B of FIG. 2) after etching through the dielectric material to prevent oxidation of an exposed metal of base conductor 314 (e.g., a metal-filled via or trench in a lower level of the semiconductor device). By depositing the seed layer soon after exposing the metal of base conductor 314, there is a reduction in the formation of metal oxides on the base conductor, which reduces resistance at the interface at the bottom of the interconnect after metal fill has occurred. In some embodiments, the seed layer covers an inner sidewall of the antireflective layer 302, the poisoned layer 303, the metal hard mask 304, and the antireflective layer 306. In some embodiments, the poisoned layer 303 is an interior sidewall (see element 104C of FIG. 1B) of the metal hard mask 304. In some embodiments, the poisoned layer is a top portion (see element 104D of FIG. 1B) of the exposed metal hard mask 104 material.

Figure 4:
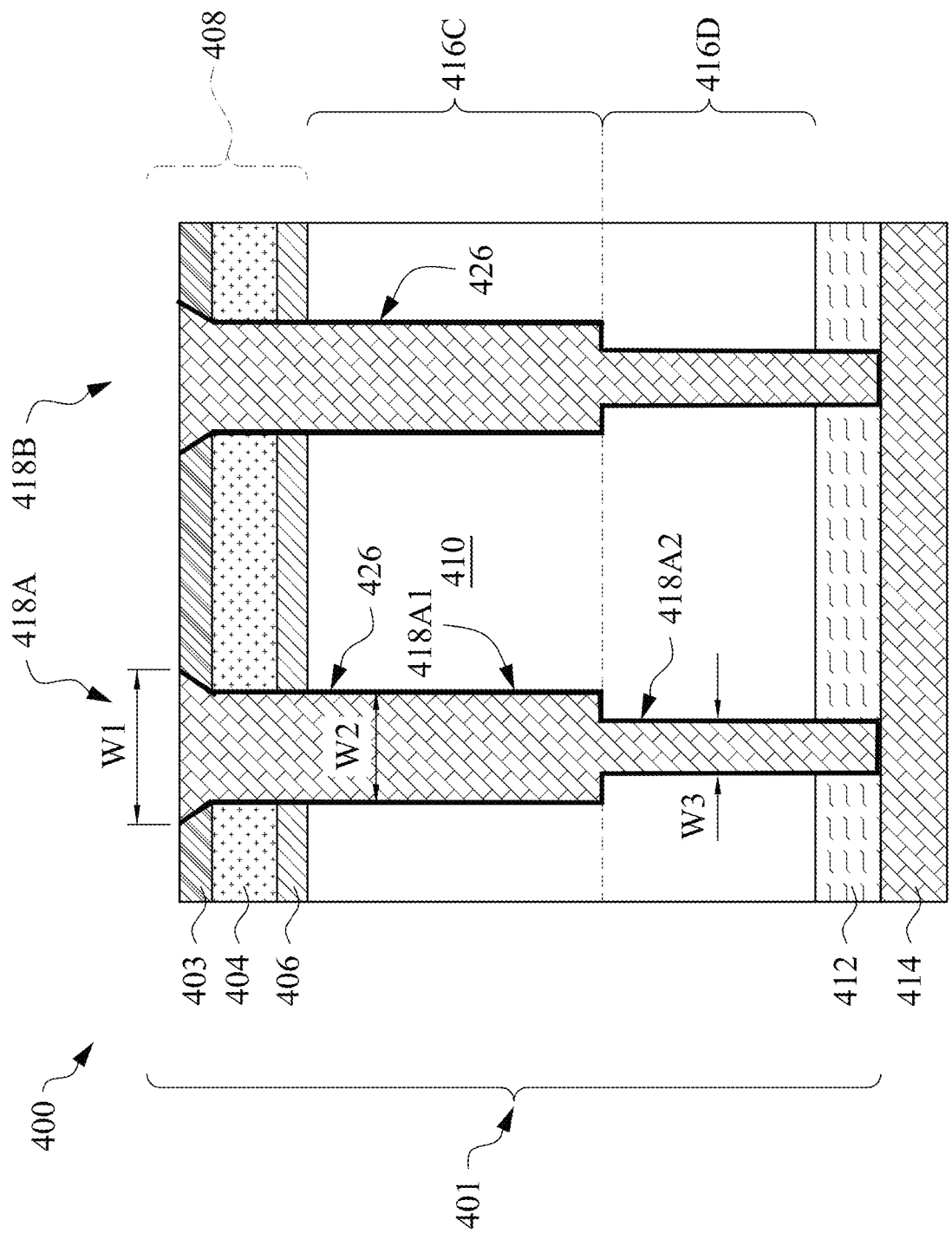
FIG. 4 is a cross-sectional diagram of a semiconductor device with a copper interconnect during a manufacturing process, in accordance with some embodiments.
Figure 5:
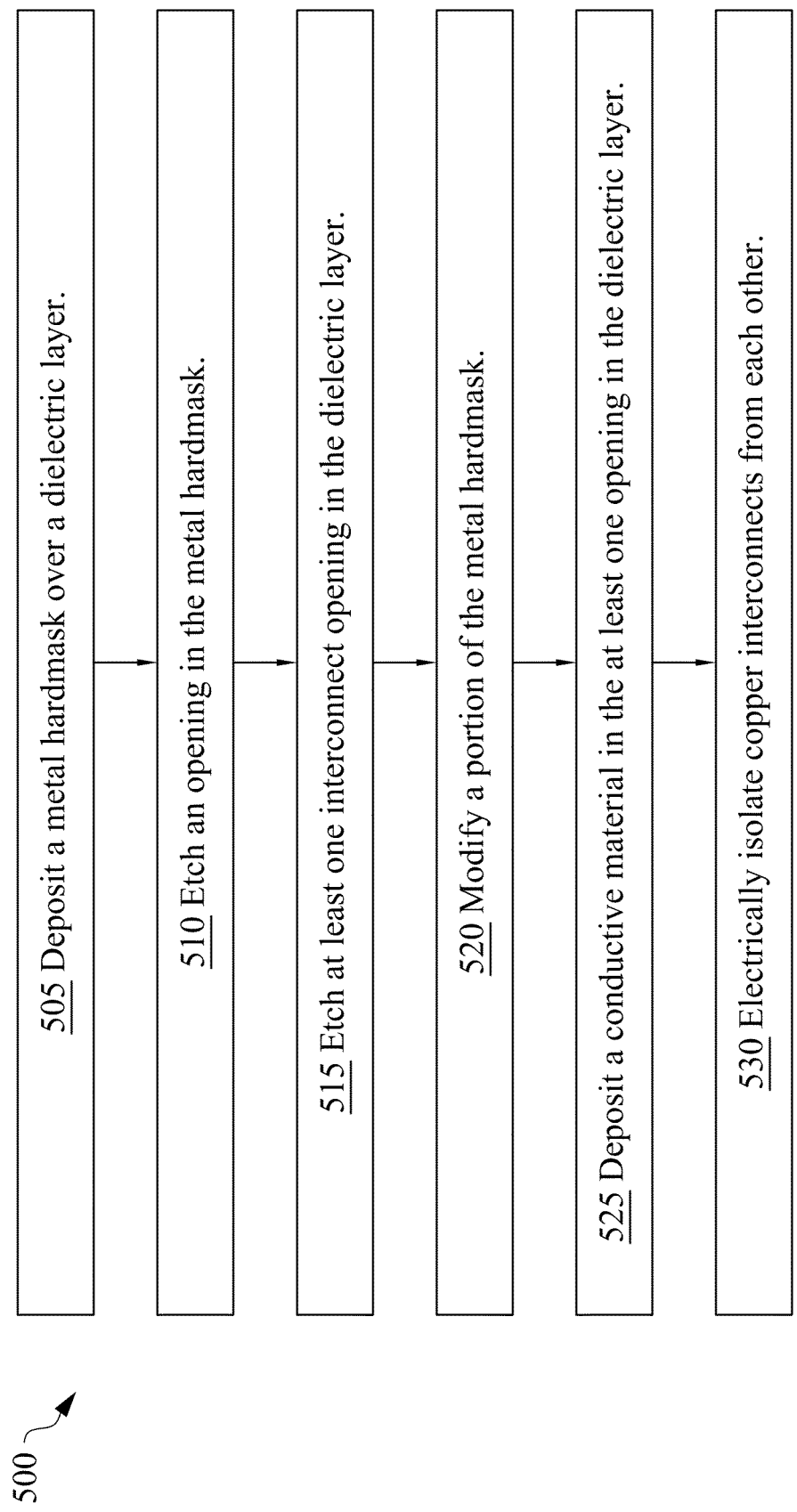
FIG. 5 is a flow diagram of a method of making a copper interconnect, in accordance with some embodiments.

FIG. 4 is a cross-sectional diagram of a semiconductor device 400 with a copper interconnect structure 401, in accordance with some embodiments. Method 500 includes an operation 530 in which copper interconnects formed in operation 530 are electrically isolated from each other. Electrical isolation of copper interconnect structures occurs by chemical mechanical polishing (CMP) processes performed on a top surface of a die or semiconductor wafer. Electrical isolation of copper interconnects is deemed complete when the materials positioned laterally between interconnects (see interconnect 418A and 418B of FIG. 4) is significantly less.

In FIG. 4, elements similar to structures described previously in FIG. 1 share a same, incremented by 300. Interconnect 418A and interconnect 418B extend through metal hardmask 408, dielectric material 410, an etch stop layer 412 to make electrical connection with base conductive layer 414. Interconnect 418A has an upper portion 418A1 with a first width W1 at a top of the upper portion 418A1. The first width corresponds to the top most portion of the upper portion 418A1 at a same vertical distance from the substrate 410 as the poisoned layer 403. The first width W1 is greater than the width of the remainder of the upper portion 418A1. A bar region 416C of a dual damascene interconnect structures 418A and 418B is formed in the trench portion of interconnect structure opening. A via region 416D of interconnect structures 418A and 418B extends through a lower region of dielectric layer 410. Metal hardmask 408, shown in FIG. 4, is optionally removed from a top surface of dielectric layer 410, according to the material of the metallic layer. In some embodiments, metal hardmask 408 includes a silicon nitride layer, and the metal hardmask remains after bulk conductive material, such as electroplated copper, is removed from a top surface of the metal hardmask, isolating the dual damascene interconnect structures from each other. A silicon nitride layer does not have sufficiently high conductivity to allow current flow between interconnect structures. A metallic layer that includes, e.g., titanium nitride, has sufficient electrical conductivity that the metallic layer is removed to prevent leakage current between interconnect structures. Metallic layers are removed from a top surface of dielectric layer 410 by, e.g., chemical mechanical polishing (CMP).

Figure 6:
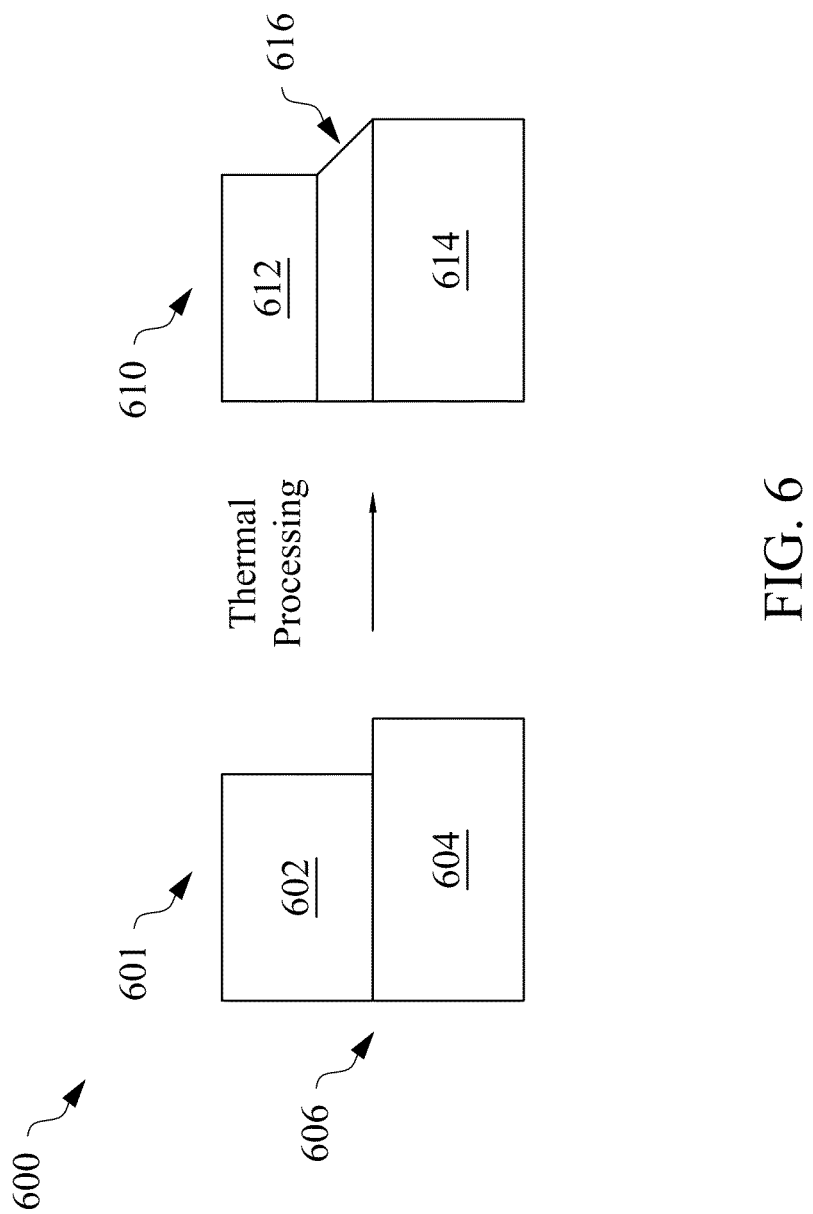
FIG. 6 is a cross-sectional diagram of layers of an integrated circuit during a manufacturing process, in accordance with some embodiments.

FIG. 6 is a cross-sectional diagram of layers of an integrated circuit 600 during a manufacturing process, in accordance with some embodiments. The present disclosure is directed to integrated circuits formed through a method of smoothing a sidewall of an integrated circuit interconnect opening before filling the interconnect opening with metal to make an interconnect structure (e.g., a trench and via in a dual damascene structure of a layer of an integrated circuit). Integrated circuit 600 has an interface 606 between a first layer 602 and a second layer 604. In some embodiments the first layer is a metallic layer and the second layer is an antireflective layer. In some embodiments, the first layer is an antireflective layer and the second layer is a metallic layer. A metallic layer is a layer of, e.g., metal nitride or a metallic oxy-nitride layer. In structure 601, the first layer and the second layer are depicted before thermal processing to smooth the sidewall. Structure 610 describes a first layer 612 (comparable to first layer 602) and second layer 614 (comparable to second layer 604) after a structure has undergone thermal processing. Thermal processing of structure 601 generates, at the location of interface 601, a "poisoned" layer, in which the materials from the first layer and the second layer inter-diffuse to form a third material, or an interfacial layer 616, with properties between the properties of the first layer 612 and the second layer 614. Among the properties of the interfacial layer 616 between the properties of the first layer 612 and the second layer 614 are, among others, (1) chemical composition, and (2) lattice constant. The chemical composition of interfacial layer ranges from the composition of first layer 612 at a top side of the interfacial layer, to the chemical composition of second layer 614 at the bottom side of the interfacial layer. The variation in chemical composition through the vertical thickness of interfacial layer 616 causes the lattice constant of the interfacial film to vary through the vertical thickness of the interfacial. By inter-diffusing materials of two films into each other, the intermediate layer smoothly transitions a sidewall profile from the first layer to the second layer to remove a kink associated with different opening diameters in an interconnect opening (before metal deposition) at different layers of the metal hardmask (e.g., the metal/metallic layer, and one antireflective layer). In some embodiments, the first layer is a metallic layer (a metal layer, or a metal nitride layer) and the second layer is an antireflective layer. In some embodiments, the first layer is an antireflective layer and the second layer is a metallic layer. The thermal processing described in the method of the present disclosure works to smooth kinks at interfaces of a metallic layer and an antireflective layer, whether the antireflective layer of the metallic layer is on top in the film stack.

A method includes operations of depositing a metal hardmask over a dielectric layer; etching a metal hardmask opening in the metal hardmask to expose a top surface of the dielectric layer; etching at least one interconnect opening in the dielectric layer, to expose a top surface of a base conductive layer; modifying a sidewall of the metal hardmask opening; and depositing a conductive material in the metal hardmask opening and the at least one interconnect opening. In some embodiments, the method further comprises removing a portion of the conductive material on a top surface of the metal hardmask. In some embodiments, the method further comprises removing the metal hardmask to electrically isolate the conductive material in each of the at least one interconnect opening. In some embodiments, depositing a metal hardmask further comprises: depositing a first anti-reflection layer over the dielectric layer; and depositing a metallic layer over the dielectric layer. In some embodiments, the method further comprising depositing a second anti-reflection layer over the dielectric layer, such that the metallic layer is between the first anti-reflection layer and the second anti-reflection layer. In some embodiments, etching the at least one interconnect opening further comprises: etching at least one trench in the dielectric through the metal hardmask opening; depositing a layer of mask material over the metal hardmask and in the at least one trench; patterning the mask material to form an opening through the mask material in the at least one trench; and etching at least one via through the dielectric material to expose the base conductive layer below the dielectric material. In some embodiments, depositing a conductive material further comprises depositing a seed layer on the sidewall of the metal hardmask, a trench sidewall of the at least one trench, and a via sidewall of the at least one via. In some embodiments, modifying the sidewall of the metal hardmask opening further comprises annealing the metal hardmask to diffuse metal atoms of the metallic layer into the first anti-reflection layer, wherein the metallic layer is between the first anti-reflection layer and the dielectric layer. In some embodiments, modifying the sidewall of the metal hardmask opening further comprises exposing the first anti-reflection layer and the metallic layer to a nitrogen-containing plasma.

Aspects of the present disclosure relate to a method of making an interconnection structure that comprises depositing a dielectric layer over a first copper interconnect structure; depositing a metal hardmask over the dielectric layer; etching a metal hardmask opening in the metal hardmask; etching a first portion of an interconnect structure opening in the dielectric layer; etching a second portion of the interconnect structure opening in the dielectric layer; poisoning a layer of the metal hardmask over to the dielectric layer; and depositing a conductive material in the interconnect structure opening through the metal hardmask opening. In some embodiments, the depositing the metal hardmask further comprises depositing a first anti-reflection layer on a metallic layer over the dielectric layer. In some embodiments, poisoning the layer of the metal hardmask further comprises annealing the metal hardmask to diffuse the metallic and the first anti-reflection layer into each other. In some embodiments, poisoning the layer of the metal hardmask further comprises exposing layers of the metal hardmask to a nitrogen-containing plasma. In some embodiments, depositing a conductive material further comprises sputtering a copper seed layer onto sidewalls of the poisoned metal hardmask and sidewalls of the interconnect structure opening in the dielectric layer. In some embodiments, etching a second portion of the interconnect structure opening in the dielectric layer further comprises depositing a mask layer over the metal hardmask and the first portion of the interconnect structure opening; patterning the mask layer to have an opening extending into the first portion of the interconnect structure; and etching a lower portion of the dielectric layer.

Aspects of the present disclosure relate to a device, comprising a metal hardmask layer over a dielectric layer; and an interconnect structure extending through the metal hardmask layer and the dielectric layer and electrically connected to a base conductive layer below the dielectric layer; wherein the metal hardmask layer has a poisoned layer therein. In some embodiments of the device, the metal hardmask further comprises a metallic layer against the poisoned layer. In some embodiments, the interconnect structure has a first diameter at a top layer of an metal hardmask, a second diameter at a metallic layer of the metal hardmask, and a third diameter at the poisoned layer of the metal hardmask, where the third diameter is smaller than the first diameter and larger than the second diameter. In some embodiments, the interconnect structure further comprises copper or a copper alloy. In some embodiments, the metallic layer further comprises titanium nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   depositing a metallic hardmask over a dielectric layer, wherein depositing the metallic hardmask comprises:
      depositing a first anti-reflection layer over the dielectric layer; and
      depositing a metallic layer directly over the first anti-reflection layer;
   etching a metallic hardmask opening in the metallic hardmask to expose a top surface of the dielectric layer;
   etching at least one interconnect opening in the dielectric layer, to expose a top surface of a base conductive layer;
   modifying a sidewall of the metallic hardmask opening by adding non-metal atoms into the metallic layer of the metallic hardmask; and
   depositing a conductive material in the metallic hardmask opening and the at least one interconnect opening.

2. The method of claim 1, further comprising removing a portion of the conductive material on a top surface of the metallic hardmask.

3. The method of claim 2, further comprising removing the metallic hardmask.

4. The method of claim 1, wherein modifying the sidewall of the metallic hardmask opening further comprises annealing the metallic hardmask to diffuse metal atoms of the metallic layer into the first anti-reflection layer.

5. The method of claim 1, wherein modifying the sidewall of the metallic hardmask opening further comprises exposing the first anti-reflection layer and the metallic layer to a nitrogen-containing plasma.

6. The method of claim 1, further comprising depositing a second anti-reflection layer over the dielectric layer, such that the metallic layer is between the first anti-reflection layer and the second anti-reflection layer.

7. The method of claim 1, wherein etching the at least one interconnect opening further comprises:
   etching at least one trench in the dielectric layer through the metallic hardmask opening;
   depositing a layer of mask material over the metallic hardmask and in the at least one trench;
   patterning the mask material to form an opening through the mask material in the at least one trench; and
   etching at least one via through the dielectric layer to expose the base conductive layer below the dielectric layer.

8. The method of claim 1, further comprising changing a slope of the metallic hardmask by poisoning the metallic hardmask.

9. The method of claim 1, wherein modifying the sidewall of the metallic hardmask comprises annealing the metallic hardmask and exposing the metallic hardmask to a plasma.

10. A method of making an interconnection structure, comprising:
- depositing a dielectric layer over a first copper interconnect structure;
- depositing a metallic hardmask over the dielectric layer;
- etching a metallic hardmask opening in the metallic hardmask;
- etching a first portion of an interconnect structure opening into the dielectric layer;
- etching a second portion of the interconnect structure opening into the dielectric layer;
- modifying a sidewall of the metallic hardmask opening by thermally processing the metallic hardmask after etching the first portion of the interconnect structure opening into the dielectric layer; and
- depositing a conductive material in the interconnect structure opening through the metallic hardmask opening.

11. The method of claim 10, wherein depositing the metallic hardmask further comprises depositing a first anti-reflection layer on the dielectric layer, a metallic layer over the first anti-reflection layer, and a second anti-reflection layer over the metallic layer.

12. The method of claim 11, wherein thermally processing the metallic hardmask further comprises annealing the metallic hardmask to a temperature between 600° Celsius and 1000° Celsius for an anneal time ranging from 60 seconds to 1 second.

13. The method of claim 10, wherein modifying the sidewall comprises poisoning layers of the metallic hardmask further comprises exposing the layers of the metallic hardmask to a nitrogen-containing plasma.

14. The method of claim 10, wherein depositing a conductive material further comprises sputtering a copper seed layer onto sidewalls of a poisoned metallic hardmask and sidewalls of the interconnect structure opening in the dielectric layer.

15. The method of claim 10, further comprising changing a slope of a sidewall of the metallic hardmask by a thermal process.

16. A method, comprising:
- depositing a dielectric layer over a substrate;
- depositing a hardmask layer over the dielectric layer, wherein depositing the hardmask layer comprises depositing an antireflective layer over the dielectric layer and depositing a metallic layer over the dielectric layer, and a top surface of the antireflective layer is in direct contact with a bottom surface of the metallic layer;
- exposing a top surface of the dielectric layer through a hardmask layer opening;
- etching an opening in the dielectric layer;
- modifying a sidewall of the hardmask layer opening after etching the opening in the dielectric layer; and
- filling, with a conductive material, the opening in the dielectric layer through the hardmask layer opening having the modified sidewall.

17. The method of claim 16, wherein modifying the sidewall of the hardmask layer opening further comprises inter-layer diffusion of the antireflective layer and the metallic layer.

18. The method of claim 17, wherein filling the dielectric layer opening further comprises:
- depositing a seed layer on a dielectric layer sidewall and the hardmask layer opening having the modified sidewall; and
- electroplating a conductive material over the seed layer.

19. The method of claim 16, wherein modifying a sidewall of the hardmask layer opening further comprises annealing the hardmask layer.

20. The method of claim 16, wherein modifying the sidewall of the hardmask layer opening comprises annealing the hardmask layer and exposing the hardmask layer to a plasma.

* * * * *